(12) United States Patent
Riley

(10) Patent No.: US 9,202,590 B2
(45) Date of Patent: Dec. 1, 2015

(54) LOW POWER SHIFT REGISTER

(71) Applicant: Broadcom Corporation, Irvine, CA (US)

(72) Inventor: Jeffrey Allan Riley, Utrecht (NL)

(73) Assignee: Broadcom Corporation, Irvine, CA (US)

( * ) Notice: Subject to any disclaimer, the term of this patent is extended or adjusted under 35 U.S.C. 154(b) by 261 days.

(21) Appl. No.: 13/962,699

(22) Filed: Aug. 8, 2013

(65) Prior Publication Data

US 2015/0032952 A1 Jan. 29, 2015

Related U.S. Application Data

(60) Provisional application No. 61/859,425, filed on Jul. 29, 2013.

(51) Int. Cl.
*H03M 9/00* (2006.01)
*G11C 19/00* (2006.01)
*G11C 7/20* (2006.01)

(52) U.S. Cl.
CPC *G11C 19/00* (2013.01); *G11C 7/20* (2013.01); *H03M 9/00* (2013.01)

(58) Field of Classification Search
CPC ............ H03M 9/00; G11C 19/00; G11C 7/20
USPC .................................................. 341/100–101
See application file for complete search history.

(56) References Cited

U.S. PATENT DOCUMENTS

| | | | | |
|---|---|---|---|---|
| 5,175,819 A * | 12/1992 | Le Ngoc et al. | ................ | 710/71 |
| 5,982,309 A * | 11/1999 | Xi et al. | ........................ | 341/101 |
| 6,169,501 B1* | 1/2001 | Ryan | .............................. | 341/101 |
| 6,806,819 B2* | 10/2004 | Hoffmann | ..................... | 341/100 |
| 7,213,090 B2* | 5/2007 | Ishida et | ......................... | 710/71 |
| 8,290,114 B2 | 10/2012 | Tsai | | |
| 8,526,568 B2 | 9/2013 | Osame et al. | | |
| 8,537,094 B2 | 9/2013 | Yang et al. | | |
| 2012/0200436 A1* | 8/2012 | Wang | ............................ | 341/100 |

FOREIGN PATENT DOCUMENTS

EP          1 959 423 A2      8/2008

* cited by examiner

*Primary Examiner* — Khai M Nguyen
(74) *Attorney, Agent, or Firm* — Brinks Gilson & Lione

(57) ABSTRACT

A clock control circuit for a parallel in, serial out (PISO) shift register helps save power. The clock control circuit selectively clocks the shift register as it converts a parallel input to a serial output. For example, the clock control circuit may provide clock signals to the flip flops (or other buffers) in the shift register that will receive data elements provided with the parallel input. However, the clock control circuit withholds clock signals from flip flops that will not receive data elements provided with the parallel input, or that have already been received by a particular flip flop. As the parallel loaded input elements propagate serially through the shift register, on each clock cycle an additional memory no longer needs to be clocked. The memory no longer needs to be clocked because that memory has already propagated its loaded input element to the following memory, and no further element provided in the N element parallel loaded data is incoming.

20 Claims, 4 Drawing Sheets

LOW POWER SHIFT REGISTER

CROSS REFERENCE TO RELATED APPLICATIONS

This application claims priority to provisional application Ser. No. 61/859,425, filed Jul. 29, 2013, which is incorporated by reference in its entirety.

TECHNICAL FIELD

This disclosure relates to power consumption in digital logic. This disclosure also relates to reducing power consumed by shift registers, such as parallel-in, serial-out shift registers.

BACKGROUND

Rapid advances in electronics and communication technologies, driven by immense customer demand, have resulted in the widespread adoption of electronic devices of every description. These devices process digital data in many different ways, and often include shift registers to store and propagate digital data. Reducing power consumption will extend battery life, save money, and have other desirable effects.

DETAILED DESCRIPTION

Figure 1:
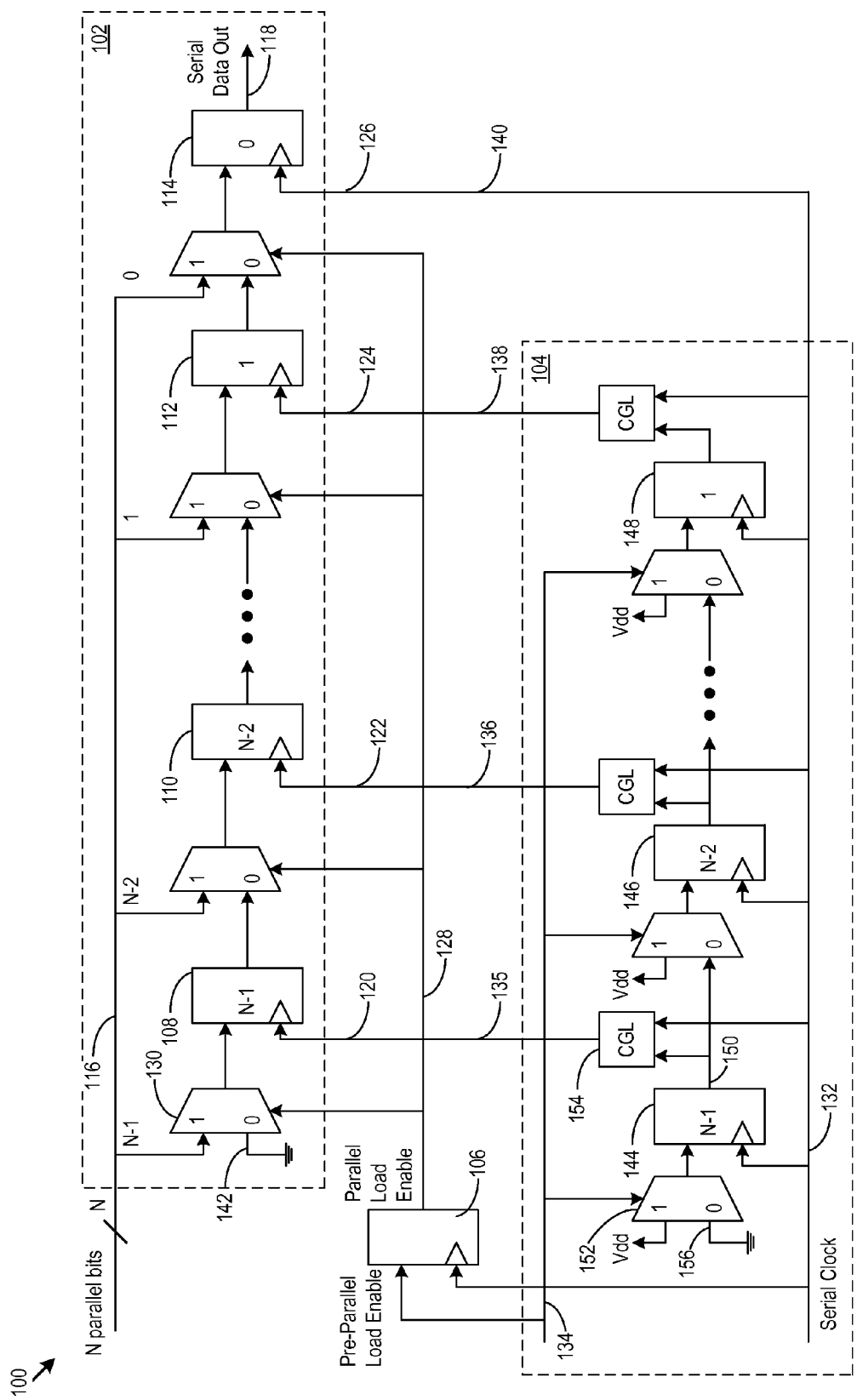
FIG. 1 shows an example of circuit with a shift register and clock control.

FIG. 1 shows an example of a circuit 100. The circuit 100 includes a shift register 102 connected to clock control logic 104. A parallel load circuit 106 is also present. The circuit 100 may be implemented in many different ways, several examples of which are given next. Note first, however, that in FIG. 1 one shift register 102 is present, but W shift registers, each defining a serial channel of depth N, may be stacked in parallel to create a multiple element serialized output of width W. One instance of a clock control logic 104 may be used to selectively clock as many of the serial channels as desired. The architecture is described further below with respect to FIG. 2 in conjunction with power saving estimates.

As one example implementation, the shift register 102 includes serially connected memories (e.g., 108, 110, 112, 114) configured to convert N elements received on the parallel input 116 to serial elements on a serial output 118. In that respect, the memories may be flip-flops, such as D flip-flops, or other types of memories, and the depth of the shift register 102 is N, corresponding to the number of elements loaded in parallel. The memories may include a clock input (e.g., 120, 122, 124, 126, 128). A clock pulse applied to the clock input causes the data present at the input of the memory to propagate through to the output of the memory, and thus to the next memory serially in order.

The parallel load circuit 106 provides a parallel load enable input 128 to the shift register 102. In the example shown in FIG. 1, the parallel load enable input 128 controls selection logic, such as the multiplexer 130. The selection logic determines the input received by the memories on the next clock pulse. For example, the input may be a particular parallel load element determined by the parallel load input 116. Alternatively, the input may be the output of the prior memory in the serially connected chain of memories, and a preset '0' or '1' input 142 for the last memory in the chain (e.g., memory 108). The parallel load enable input 128 follows the pre-parallel load enable signal 134 when a serial clock propagates the pre-parallel load enable signal 134 through the parallel load enable circuit 106 (e.g., a D flip-flop clocked with the serial clock input 132). In that respect, the parallel load enable circuit 106 delays the pre-parallel load enable signal 134 by one clock, while the pre-parallel load enable signal 134 sets the clock enable bits in the clock control circuit 104 in preparation for the parallel load and shifting operation.

The circuit 100 also includes clock control logic 104. The clock control logic 104 includes gated clock signal outputs (e.g., 135, 136, 138), and an ungated clock signal 140. The gated clock signal outputs selectively provide clock signal pulses to the shift register memories. In particular, the clock control logic 104 generates clock signals to those memories that will next receive data elements that have not already passed through the memory. In addition, the data elements are part of the parallel load input, meaning that the clock control logic 104 may prevent preset data (e.g., present on the preset input 142) from propagating through the shift register 102. In other implementations, the multiplexer 130 may be omitted, and the N−1 element of the parallel input 116 may connect directly to the data input of the memory 108. The clock control logic 104 also withholds clock signals from those memories that would only be receiving data elements that have already passed through the memory, or that is preset data.

In other words, as the parallel loaded input elements propagate serially through the shift register 102, on each clock cycle an additional memory (starting with the last memory 108) no longer needs to be clocked. The memory no longer needs to be clocked because that memory has already propagated its loaded input element to the following memory, and no further element provided in the N element loaded data is incoming. Accordingly, the clock control logic 104 withholds a clock pulse from an increasing number of memories, as the N elements loaded in parallel propagate through the shift register 102. The result is that fewer than all of the memories are clocked, and an increasing number of memories are not clocked, as the loaded data propagates out the serial output 118. In that regard, the clock control logic 104 avoids the power wasted to clock the preset input 142 or any other unneeded elements down the shift register 102.

In one implementation, the clock control logic 104 includes serially connected memories (e.g., 144, 146, 148) configured to propagate clock enable bits on clock enable inputs (e.g., 150) as the parallel input is converted to the serial output. The clock control logic 104 includes initialization logic (e.g., 152) in communication with the serially connected memories for selectively setting and selectively clearing the clock enable bits. In the example shown in FIG. 1, the initialization logic 152 is a two input multiplexer that selects between the pre-parallel load enable signal 134 and a cleared (e.g., '0' value) input 156. The two input multiplexer may be implemented in or replaced by combinatorial logic.

Accordingly, when the shift register 102 is parallel loaded one clock cycle after the pre-parallel load enable signal 134, the pre-parallel load enable signal 134 has already caused each memory in the clock control logic 104 to be set with an active clock enable bit. As such, prior to the parallel load, the input to each instance of clock gating logic 154, abbreviated 'CGL' in FIG. 1, includes an asserted clock enable bit. The other input to the clock gating logic is the serial clock input 132. Thus, on the first clock cycle of the serial clock input 132 of a new parallel to serial conversion, each memory in the shift register 102 receives a propagation signal in the form of a clock pulse. The clock gating logic 154 may be implemented in many different ways, including as a 2 input AND gate proceeded by an optional latch on the clock enable signal, as just one example.

The parallel load enable signal 128 is asserted during a parallel load, but de-asserted for the shifting operation until the next parallel load operation occurs. Accordingly, each pulse on the serial clock input 132 causes a clock enable bit to be cleared, first by clocking in the cleared input 156, then by propagating the cleared input down the chain of serially connected memories in the clock control logic 104. The clock enable bits are cleared starting with the first memory 144, and continuing, once per serial clock cycle, to propagate through the remaining serially connected memories in the clock control logic 104 from memory 144 to memory 146 to memory 148. Accordingly, each clock cycle, one fewer memory in the shift register 102 receives a serial clock pulse, but since the memories not being clocked no longer propagate any data needed by subsequent memories, the serial output 118 still delivers a serialized version of the N elements loaded in parallel.

Note that the first memory 114 in the serial chain may receive every clock pulse on the serial clock input 132. In effect, the clock signal for the first memory 114 is ungated. The ungated clock may be applied because the first memory 114 always has an element of data to pass to the serial output 118, assuming that no more than N clocks are applied to the N element deep shift register before it is reloaded. In other implementations, for example, the clock signal 140 for the first memory 114 may be gated off after all N elements have been shifted out and until a new N element parallel load occurs.

Expressed another way, the circuit 100 includes a shift register 102 with a serial output 118 and buffers (e.g., flip-flops) configured to serially propagate the elements (e.g., data bits) stored in the buffers to the serial output 118. A parallel load input 116 provides the elements in parallel to load into the buffers. Clock control logic 104 is in communication with the buffers to control shifting of the elements through the shift register 102. The clock control logic 104 is configured to issue propagation signals to those buffers that will next store an element included in the elements provided on the parallel load input 116 and that has not already been stored. The clock control logic 104 also withholds propagation signals from those buffers that would receive an element that those buffers have already stored and output to the next memory in series.

Figure 2:
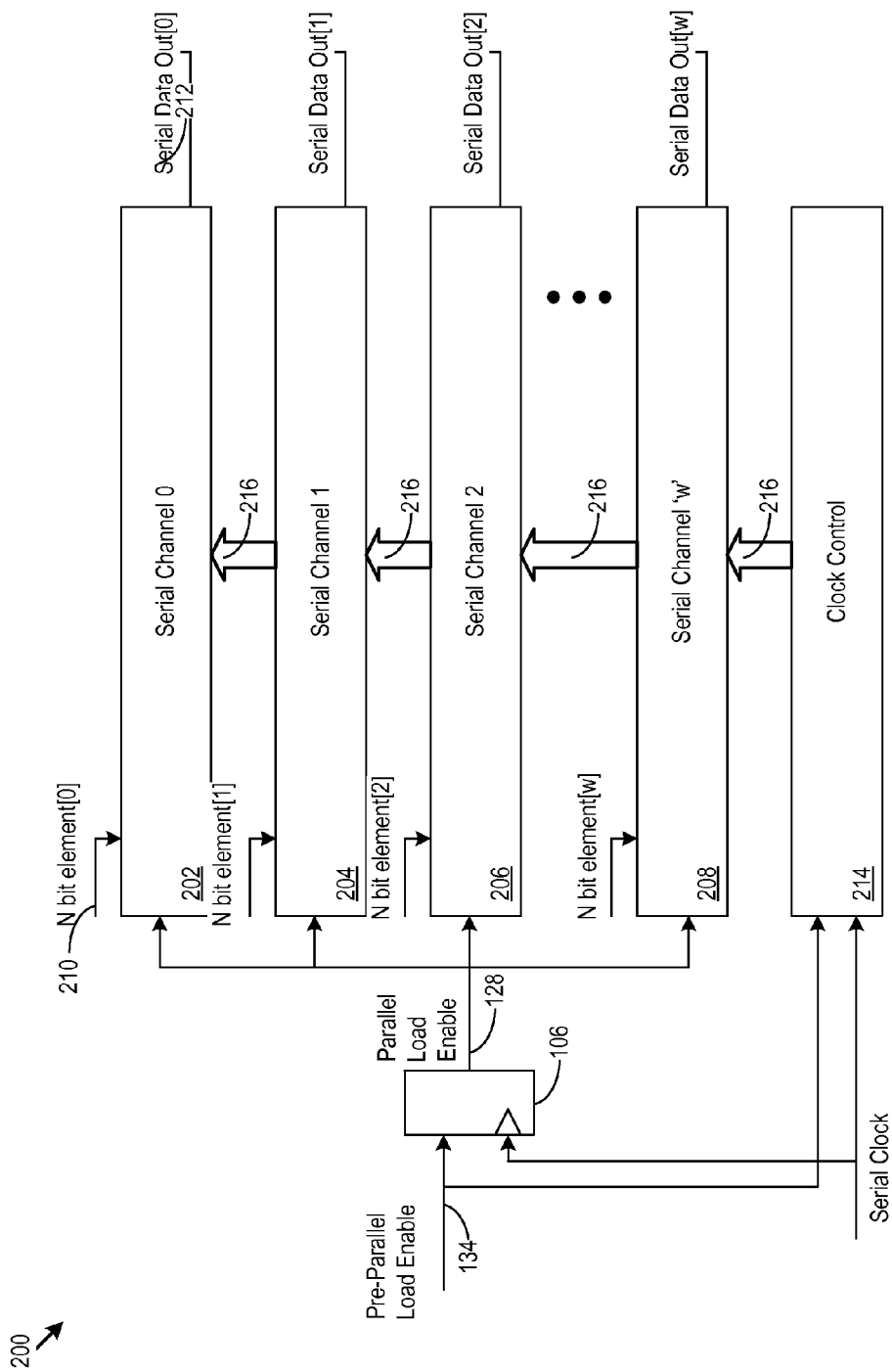
FIG. 2 shows an example of W element wide, N element deep parallel to serial shift register control.

FIG. 2 shows an example 200 of W element wide, N element deep, parallel to serial shift register control. In the example 200, there are W serial channels (e.g., 202, 204, 206, 208). Each serial channel may be implemented as a shift register 102. Thus, each serial channel includes an N element parallel load input (e.g., 210) and a serial output (e.g., 212). A common parallel load enable input 128 may be provided to each serial channel.

Note that one instance of clock control logic 214 is present. The clock control logic 214 may be implemented as the clock control logic 104 shown in FIG. 1. The clock control logic 214 provides gated clock signal outputs 216 to each instance of the shift registers that implement the serial channels. In the manner shown in FIG. 1, the gated clock signal outputs 216 selectively provide and withhold clock signal pulses to the shift register memories in the serial channels.

When one instance of the clock control logic 214 controls W serial channels, an approximate power saving may be determined according to:

$$C_T = N*N*W = N^2 W$$

which represent the total clock cycles applied to memory elements in order to propagate W sets of N element deep parallel loaded data to serial outputs (N*w memory elements, clocked N times). Then:

$$C_G = W * \sum_{k=0}^{N-1} \frac{N(n-1)W}{2}$$

represents the total clock cycles per parallel to serial conversion that are saved (e.g., gated off) by the clock control logic. The clock control logic 104 adds some clock cycles for clock control:

$$C_A = (N-1)+1 = N$$

which represents the total clock cycles per parallel to serial shift conversion applied to the clock control logic 104 and the parallel load circuit 106. An approximate power saving may then be expressed (in terms of clock cycles) as:

$$P_S = \frac{C_G - C_A}{C_T} = \frac{\frac{N(N-1)W}{2} - N}{N^2 W} = \frac{1}{2} - \frac{1}{2N} - \frac{1}{NW}$$

As N and W grow larger, the power savings asymptotically approaches a maximum of 50%. As a specific example, when N=8 and W=12, the power saving is approximately 43%.

Figure 3:
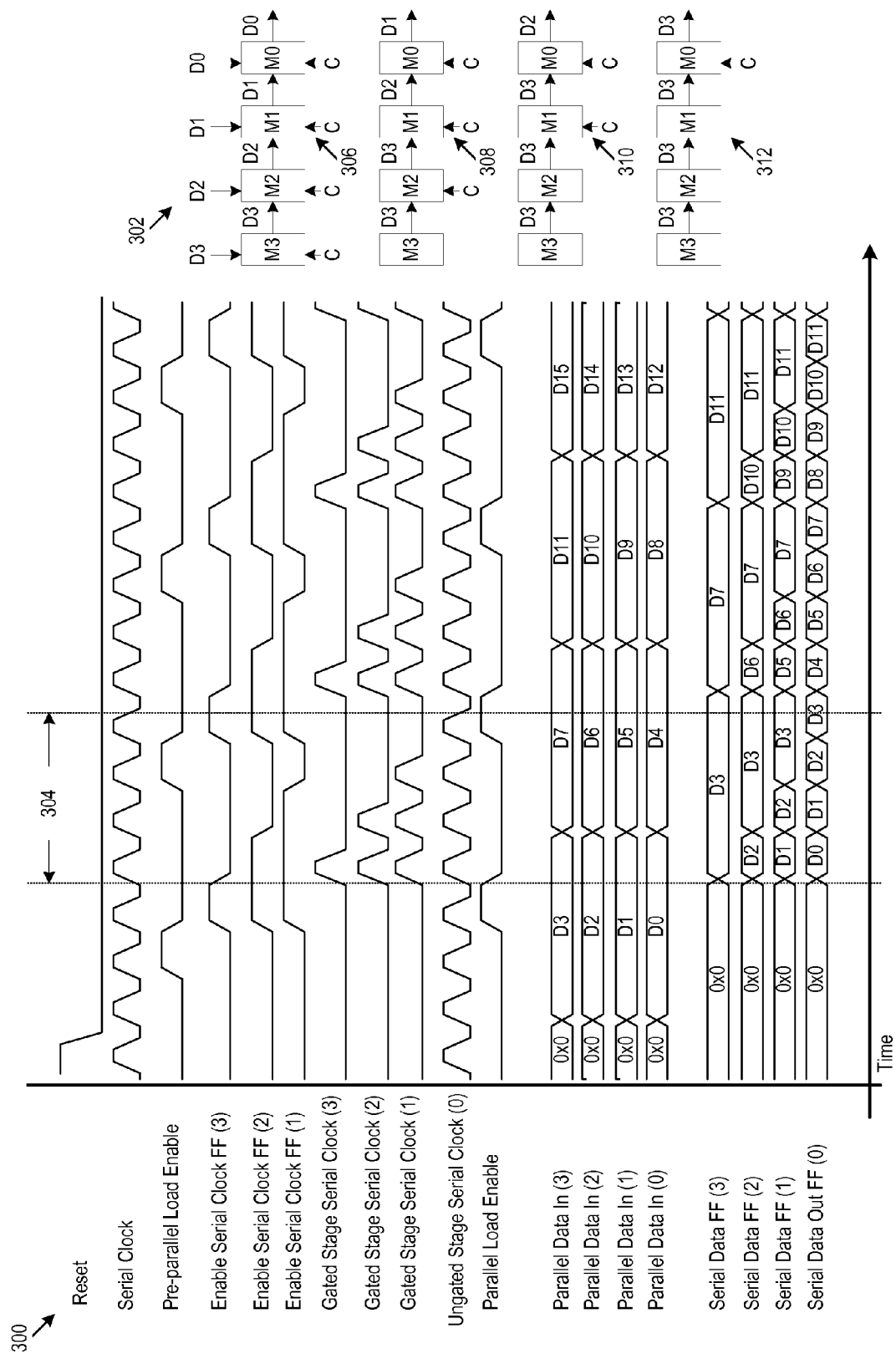
FIG. 3 shows an example timing diagram.

FIG. 3 shows an example timing diagram 300. In this example, a 4 element deep (N=4) shift register converts parallel loaded data elements: {D0, D1, D2, D3}, {D4, D5, D6, D7}, and {D8, D9, D10, D11}, to serial output: {D0, D1, D2, D3, D4, D5, D6, D7, D8, D9, D10, D11}. The data elements may be data bits or any other unit of information, and they may constitute an aggregation (e.g., a nibble of a byte), but they need not constitute an aggregation (e.g., the four bits may come from unrelated data entities).

A high level view 302 of the shift register shows the first conversion, with {D0, D1, D2, D3} loaded into memories M3, M2, M1, and M0, then converted to serial data over four clocks cycles. This conversion corresponds to the timing section 304 in the timing diagram 300, with the parallel load enable signal 128 going active to start the parallel load. The gated clock signals for M3, M2, and M1 and the ungated clock signal M0 show how the clock signals convert the parallel data to serial. In particular, the gated clock signals M3, M2, and M1 show the selective application of clock signals to those memories that have yet to receive the particular data element of the parallel loaded data that is currently present at their input.

With respect to M1, as an example, on the first clock, M1 has not yet received D1, and M1 is provided with a clock pulse (306). On the next clock, M1 has not yet received D2, and M1 is again provided with a clock pulse (308). Similarly, on the next clock M1 has not yet received D3, and M1 receives another clock pulse (310). However, on the next clock, M1 has already received element D3, and the clock control logic 104 does not provide a clock pulse to M1 (312). The memory M3 receives one clock pulse to accept D3, but the clock control logic 104 provides no further clock pulses to M3 because M3 has received every data element of the parallel loaded data that will be present at its input. In FIG. 3, the 'Enable Serial Clock FF (1), (2), and (3)' signals show how clock gating propagates through the clock control logic 104, as the data itself propagates.

Expressed another way, the clock control logic 104 provides N-p clock pulses to a memory at position p in the serial chain during a parallel to serial conversion. The parameter 'p' ranges from 0 for the first memory in the series (e.g., M0, p=0) to N−1 for the last or Nth memory in the series (e.g., M3, p=3).

Figure 4:
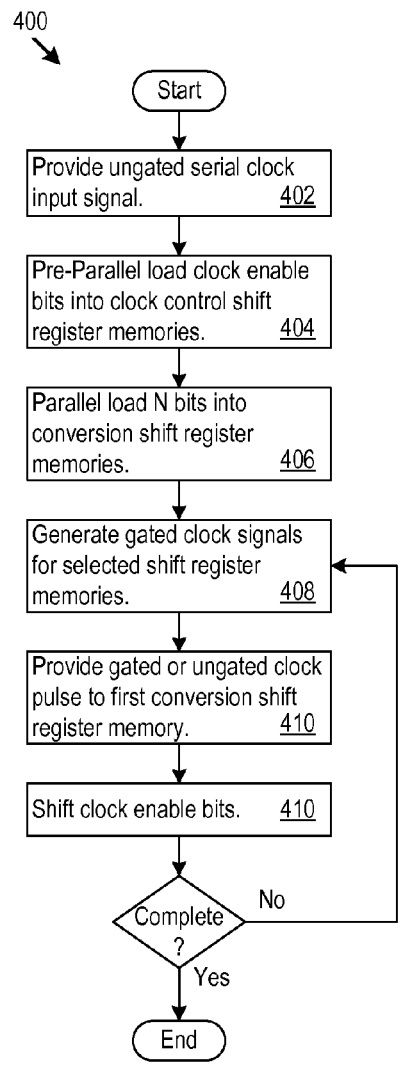
FIG. 4 shows example logic for converting parallel loaded data elements to a serial, with power saving clock control.

FIG. 4 shows example logic 400 for one instance of converting parallel loaded data elements to a serial output, with power saving clock control. The logic includes providing an ungated serial clock input signal (402) and pre-parallel loading clock enable bits into clock control shift register memories (404). The clock enable bits may correspond to the pre-parallel load enable signal 134, and may all be asserted for the first shift operation. After the pre-parallel load enable signal 134 goes inactive, inactive values are shifted in for the clock enable bits. Subsequent to loading the clock enable bits, the logic 400 parallel loads N elements into the shift register 102 (406), for example using a parallel load enable input 128.

In the clock control logic 104, the clock gating logic 154 generates gated clock signals for selected shift register memories (408). Further, the clock control logic 104 may provide a gated or an ungated clock pulse to the first memory in the shift register 102 (e.g., the memory 114) (410). With each clock cycle, the logic 400 shifts the clock enable bits in the clock control logic 104 (410).

Various implementations have been specifically described. However, many other implementations are also possible. For example, multiplexers such as the multiplexer 152 may be replaced with combinatorial logic. Further, the logic shown above may be implemented as a standard cell stored in a design library such as a Very Large Scale Integration (VLSI) library, or implemented (e.g., for simulation purposes) as instructions for execution by a processor. Accordingly, the standard cell may be placed wherever a lower power PISO shift register is desired in a digital circuit design, and may form part of a library of cells delivered with VLSI design software.

What is claimed is:

1. A circuit comprising:
    a shift register comprising first serially connected memories configured to convert a parallel input to a serial output, the memories comprising a data input; and
    clock control logic configured to:
        provide a clock pulse to those memories that have on their data input a particular data element provided in the parallel input that has not yet been stored by those memories; and
        forgo clocking those memories that have already received the particular data element provided in the parallel input.

2. The circuit of claim 1, where the clock control logic comprises:
    second serially connected memories configured to propagate clock enable bits as the parallel input is converted to the serial output.

3. The circuit of claim 2, further comprising initialization logic in communication with the second serially connected memories for selectively setting and selectively clearing the clock enable bits.

4. The circuit of claim 3, further comprising a pre-parallel load enable signal configured to determine whether specific clock enable bits are set or cleared.

5. The circuit of claim 1, where the first serially connected memories comprise flip-flops.

6. The circuit of claim 5, where the clock control logic further comprises clock gating logic configured to generate the clock pulses.

7. The circuit of claim 6, where the clock control logic further comprises clock enable inputs and a serial clock input in communication with the clock gating logic.

8. The circuit of claim 7, where the clock control logic further comprises second serially connected memories configured to be clocked by the serial clock input, and that are configured to provide the clock enable inputs.

9. A circuit comprising:
    a shift register comprising:
        a serial output;
        buffers configured to serially propagate elements stored in the buffers to the serial output;
        a parallel load input operable to provide the elements in parallel to load into the buffers; and
    shift control logic in communication with the buffers, the shift control logic configured to:
        issue propagation signals to those buffers that will next store an element included in the elements provided on the parallel load input and that has not already been stored; and
        withhold propagation signals from those buffers that would next receive an element that those buffers have already stored.

10. The circuit of claim 9, where:
    the shift control logic comprises gated clock outputs that carry the propagation signal to the buffers.

11. The circuit of claim 10, where:
    the buffers comprise flip-flops with clock inputs; and
    the gated clock outputs are in communication with the clock inputs.

12. The circuit of claim 9, where the shift control logic comprises:
    a serial clock input in communication with clock gating logic.

13. The circuit of claim 12, where the shift control logic further comprises:
    a clock enable input in communication with the clock gating logic.

14. The circuit of claim 13, where the shift control logic further comprises:
    a pre-parallel load enable input operable to set the clock enable input.

15. The circuit of claim 13, where the shift control logic further comprises:
    a pre-parallel load enable input operable to set the clock enable input responsive to the serial clock input.

16. The circuit of claim 9, where the shift control logic comprises:
    clock enable bit inputs; and
    buffers configured to serially propagate clock enable bits received on the clock enable bit inputs.

17. The circuit of claim 16, where the shift control logic further comprises:
    a serial clock input; and
    clock gating logic configured to generate the propagation signals based on the serial clock input and the clock enable bits.

18. The circuit of claim 17, where the shift control logic further comprises:
    a pre-parallel load enable signal configured to determine whether the clock enable bit inputs are true or false.

19. A circuit comprising:
serially connected memory stages comprising:
- a parallel load bit input;
- a parallel load enable input; and
- a flip-flop comprising a clock input and configured to store a specific bit present on the parallel load bit input when the parallel load enable input is active;

serially connected clock gating stages, each connected to a particular serially connected memory stage, the serially connected clock gating stages comprising:
clock gating logic configured to:
accept a serial clock input and a clock enable input; and
output a bit propagation signal responsive to the serial clock input and the clock enable input to the clock input of the flip-flop in the particular serially connected memory stage.

20. The circuit of claim 19, where the serially connected clock gating stages are further configured to accept the pre-parallel load enable input and set the clock enable input responsive to the pre-parallel load enable input.

* * * * *